United States Patent
Coban et al.

(10) Patent No.: US 9,748,963 B2
(45) Date of Patent: *Aug. 29, 2017

(54) REDUCING DISTORTION IN AN ANALOG-TO-DIGITAL CONVERTER

(71) Applicant: Silicon Laboratories Inc., Austin, TX (US)

(72) Inventors: Abdulkerim L. Coban, Austin, TX (US); Mustafa H. Koroglu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/188,272

(22) Filed: Jun. 21, 2016

(65) Prior Publication Data

US 2016/0380643 A1    Dec. 29, 2016

Related U.S. Application Data

(63) Continuation of application No. 14/747,057, filed on Jun. 23, 2015, now Pat. No. 9,407,276.

(51) Int. Cl.
*H03M 1/06* (2006.01)
*H03M 1/00* (2006.01)
(Continued)

(52) U.S. Cl.
CPC ......... *H03M 1/002* (2013.01); *H03M 1/0626* (2013.01); *H03M 1/1009* (2013.01); *H03M 1/124* (2013.01); *H03M 1/60* (2013.01)

(58) Field of Classification Search
CPC .... H03M 1/002; H03M 1/1009; H03M 1/124; H03M 1/0626; H03M 1/60
(Continued)

(56) References Cited

U.S. PATENT DOCUMENTS 6,809,676 B1 * 10/2004 Younis ................... H03M 1/60
                                                      341/157
7,301,411 B2 * 11/2007 Li Puma .............. H03B 5/1243
                                                      331/117 FE
(Continued)

OTHER PUBLICATIONS

Sachin Rao, et al., "A Deterministic Digital Background Calibration Technique for VCO-Based ADCs," IEEE Journal of Solid-State Circuits, vol. 49, No. 4, Apr. 2014, pp. 950-960.

(Continued)

*Primary Examiner* — Brian Young
(74) *Attorney, Agent, or Firm* — Trop, Pruner & Hu, P.C.

(57) ABSTRACT

In one embodiment, an apparatus includes: a first voltage controlled oscillator (VCO) analog-to-digital converter (ADC) unit to receive a first portion of a differential analog signal and convert the first portion of the differential analog signal into a first digital value; a second VCO ADC unit to receive a second portion of the differential analog signal and convert the second portion of the differential analog signal into a second digital value; a combiner to form a combined digital signal from the first and second digital values; a decimation circuit to receive the combined digital signal and filter the combined digital signal into a filtered combined digital signal; and a cancellation circuit to receive the filtered combined digital signal and generate a distortion cancelled digital signal, based at least in part on a coefficient value.

20 Claims, 12 Drawing Sheets

(51) Int. Cl.
    *H03M 1/10* (2006.01)
    *H03M 1/12* (2006.01)
    *H03M 1/60* (2006.01)

(58) Field of Classification Search
    USPC .................................................. 341/118, 155
    See application file for complete search history.

(56) References Cited

U.S. PATENT DOCUMENTS

| | | | | |
|---|---|---|---|---|
| 8,081,101 | B2* | 12/2011 | Daniels | H03M 1/1042 |
| | | | | 341/143 |
| 8,346,202 | B2 | 1/2013 | Coban et al. | |
| 8,451,159 | B1* | 5/2013 | Gupta | H03M 1/164 |
| | | | | 341/156 |
| 8,749,417 | B2 | 6/2014 | Coban et al. | |
| 8,885,106 | B2 | 11/2014 | Koroglu et al. | |
| 9,407,276 | B1* | 8/2016 | Coban | H03M 1/0626 |

OTHER PUBLICATIONS

Gerry Taylor, et al., "A Mostly-Digital Variable-Rate Continuous-Time Delta-Sigma Modulator ADC," IEEE Journal of Solid-State Circuits, vol. 45, No. 45, Dec. 2010, pp. 2634-2646.

Xinpeng Xing, et al., "A 42 fJ/Step-FoM Two-Step VCO-Based Delta-Sigma ADC in 40 nm CMOS," IEEE Journal of Solid-State Circuits, vol. 50, No. 50, Mar. 2015, pp. 714-723.

Jorg Daniels, et al., "A 0.02mm2 65nm CMOS 30MHz BW All-Digital Differential VCO-Based ADC with 64dB SNDR," IEEE 2010 Symposium on VLSI Circuits/Technical Digest of Technical Papers, 2010, pp. 155-156.

Gerry Taylor, et al., "A Reconfigurable Mostly-Digital Delta-Sigma ADC With a Worst-Case FOM of 160 dB," IEEE Journal of Solid-State Circuits, vol. 48, No. 4, Apr. 2013, pp. 983-995.

Frank Opteynde, "A Maximally-Digital Radio Receiver Front-End," ISSCC 2010/Session 25/Wireless Connectivity/25.1, IEEE International Solid-State Circuits Conference, 2010, pp. 450-451.

* cited by examiner

REDUCING DISTORTION IN AN ANALOG-TO-DIGITAL CONVERTER

This application is a continuation of U.S. patent application Ser. No. 14/747,057, filed Jun. 23, 2015, the content of which is hereby incorporated by reference.

BACKGROUND

Analog-to-digital converters (ADCs) are used in many different components to enable incoming analog signals to be converted into a digital format. This is the case, as modern semiconductors typically perform a large amount of processing in a digital domain. ADCs can be used in a wide variety of signal processing paths, ranging from low frequency applications to relatively high frequency applications. Different ADCs have different characteristics that may be suitable for particular implementations. While one suitable ADC architecture is a delta-sigma modulator, the size, power consumption and computation expense of such ADCs can be greater than desired for certain situations.

SUMMARY OF THE INVENTION

In one aspect, an apparatus includes: a first voltage controlled oscillator (VCO) analog-to-digital converter (ADC) unit to receive a first portion of a differential analog signal and convert the first portion of the differential analog signal into a first digital value; a second VCO ADC unit to receive a second portion of the differential analog signal and convert the second portion of the differential analog signal into a second digital value; a combiner to form a combined digital signal from the first and second digital values; a decimation circuit to receive the combined digital signal and filter the combined digital signal into a filtered combined digital signal; and a cancellation circuit to receive the filtered combined digital signal and generate a distortion cancelled digital signal, based at least in part on a coefficient value.

In an embodiment, the cancellation circuit is to obtain the coefficient value from a non-volatile storage. The non-volatile storage may store a plurality of coefficient values, each associated with at least one of a temperature range and a process type. In addition, a controller may be configured to select the coefficient value from the plurality of coefficient values based on temperature information of the apparatus received from at least one thermal sensor.

In an example, the cancellation circuit includes: a first function generator to generate a cubed value of the filtered combined digital signal; a gain circuit to apply the coefficient value to the cubed value to generate a cancellation signal; and a second combiner to combine the filtered combined digital signal and the cancellation signal to obtain the distortion cancelled digital signal.

In an example, the first VCO ADC unit comprises a first voltage-controlled ring oscillator and the second VCO ADC unit comprises a second voltage-controlled ring oscillator, to reduce a second-order distortion.

In another example, the cancellation circuit comprises: a first function generator to generate a cubed value of the filtered combined digital signal; a calibration circuit to receive a digitized calibration signal, calculate a power value therefrom, and generate the coefficient value based on the power value; a multiplier to generate a product of the cubed value and the coefficient value; and a second combiner to combine the product and the filtered combined digital signal. In this example, the first function generator is coupled in feed forward between the decimation circuit and the second combiner. A tone generation circuit may be configured to provide a calibration signal corresponding to the digitized calibration signal to the first and second VCO ADC units in a calibration mode to enable the calibration circuit to generate the coefficient value.

In one example, the first VCO ADC unit comprises: a ring oscillator to receive the first portion of the differential analog signal and output a plurality of phase signals; a plurality of sampler circuits to receive the plurality of phase signals and output a plurality of sampled signals; a plurality of phase detectors to detect a phase between a pair of the plurality of sampled signals; a plurality of encoders to receive the detected phase and generate binary outputs; and a differentiator to receive the binary outputs and generate the first digital value.

In another aspect, a system includes: a differential signal path to receive a differential analog signal. This differential signal path may include: an anti-aliasing filter to filter the differential analog signal; an attenuator coupled to the anti-aliasing filter to attenuate the filtered differential analog signal; an input buffer to buffer the filtered differential analog signal; and a differential ADC coupled to the input buffer, the differential ADC comprising: a first VCO ADC unit to receive and convert a first portion of the filtered differential analog signal to a first digital value; a second VCO ADC unit to receive and convert a second portion of the filtered differential analog signal to a second digital value; a first combiner to form a combined digital signal from the first and second digital values; and a correction circuit to receive the combined digital signal and generate a third-order distortion cancelled digital signal therefrom, using a coefficient value.

In an example, the first VCO ADC unit comprises a first voltage-controlled ring oscillator and the second VCO ADC unit comprises a second voltage-controlled ring oscillator, to remove second-order distortion from the combined digital signal. The first VCO ADC unit may comprise: a ring oscillator to receive the first portion of the filtered differential analog signal and output a plurality of phase signals; a plurality of sampler circuits to receive the plurality of phase signals and output a plurality of sampled signals; a plurality of phase detectors to detect a phase between a pair of the plurality of sampled signals; a plurality of encoders to receive the detected phase and generate binary outputs; and a differentiator to receive the binary outputs and generate the first digital value.

In an example, the correction circuit comprises a cancellation loop circuit having: a first function generator to generate a cubed value of the combined digital signal; a gain circuit to apply the coefficient value to the cubed value to generate a cancellation signal; and a second combiner to combine the combined digital signal and the cancellation signal to obtain the third-order distortion cancelled digital signal. The first function generator is coupled in feed forward between the first combiner and the second combiner.

In another example, the correction circuit comprises a calibration loop circuit having: a mixer to receive the combined digital signal and mix the combined digital signal with a mixing signal to obtain a mixed signal; a filter to filter the mixed signal; a second function generator to generate a squared value of the filtered mixed signal; and a third combiner to generate the coefficient value from the squared value.

In a still further aspect, a non-transitory computer readable medium includes instructions to enable a controller to be configured to: determine at least one operating parameter of a device; access an entry of a non-volatile storage of the device to obtain a coefficient value based on the at least one operating parameter; and provide the coefficient value to a cancellation circuit of an analog-to-digital converter of the device, to enable the cancellation circuit to reduce, using the coefficient value, third-order distortion in a digital value generated in the analog-to-digital converter from an analog signal.

In an example, the computer readable medium further comprises instructions to enable the controller to determine the at least one operating parameter and access the entry in a first mode, and in a second mode, to enable a calibration circuit to generate the coefficient value.

In an example, the computer readable medium further comprises instructions to enable the controller to disable the calibration circuit after generation of the coefficient value. The instructions may further enable the analog-to-digital converter to generate a product of a cubed value of the digital value and the coefficient value and combine the product with the digital value to reduce the third-order distortion.

DETAILED DESCRIPTION

In various embodiments, an ADC can be implemented with a voltage-controlled oscillator design. Such form of an ADC can provide suitable quantization for particular applications at lower power consumption, reduced area and lesser processing consumption than other ADC designs, such as a delta-sigma modulator. More specifically, ADC embodiments as described herein can be used in a number of situations where incoming signals are substantially free of interference such as adjacent channel interference due to the presence of strong blockers (as such interference may be removed by a tuner or other front end processing circuitry) prior to receipt in the ADC.

However, a VCO-based ADC may be subject to distortion, including second-order and third-order distortion. ADC embodiments described herein provide mechanisms and techniques to at least substantially reduce such second-order and third-order distortions resulting from non-linearity.

Embodiments may be used in a variety of different situations. As examples, embodiments may be used in digital TV demodulators, such as for use in DVB-T/T2 and DVB-C/C2 and DVB-S/S2. Such systems may specify a signal-to-noise ratio (SNR) of 50 dB in a 30 MHz bandwidth (for DVB-S/S2) and/or 60 dB in a 8 MHz bandwidth (for DVB-T/T2 and DVB-C/C2). Given that within a demodulator there are not strong blockers present, a high-dynamic range ADC may not be needed. As such, a VCO-based ADC as described herein may be used in such designs instead of a delta-sigma ADC. This is the case, as such delta-sigma designs may undesirably consume greater amounts of chip real estate and power consumption than a VCO-based ADC.

While a VCO-based ADC may be suitable from size, power and resolution points of view, there can be an undesirable amount of non-linearity distortions present. As will be described herein, embodiments may provide for appropriate compensation, cancellation and/or correction of such nonlinearity-based distortion.

Figure 1:
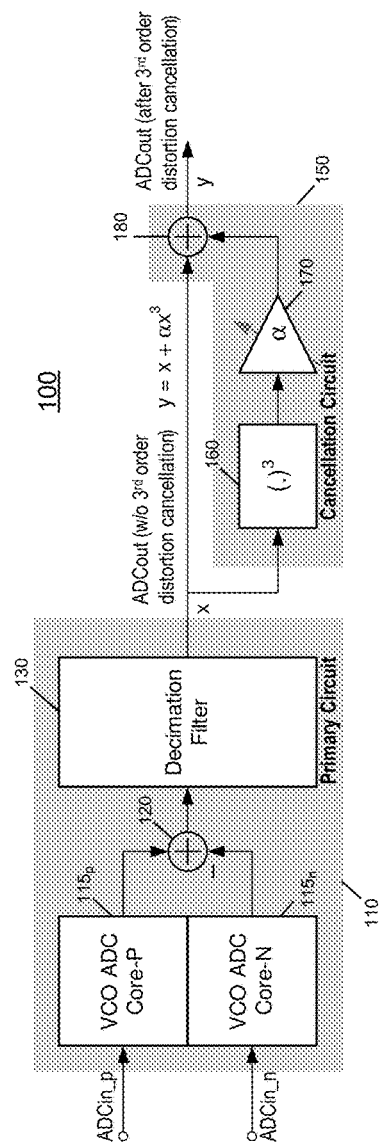
FIG. 1 is a block diagram of a high level view of an ADC in accordance with an embodiment.

Referring now to FIG. 1, shown is a block diagram of a high level view of an ADC in accordance with an embodiment. As seen in FIG. 1, ADC 100 includes a primary circuit 110 and a cancellation circuit 150. In general, primary circuit 110 is configured to perform a conversion of incoming analog signals to digital form and provide these digitized signals (which may have some amount of distortion, including third-order distortion) to cancellation circuit 150. In various embodiments, cancellation circuit 150 is configured to perform distortion removal, including cancellation of all or substantially all third-order distortion present in the digitized signals to thus provide a distortion-free (or at least substantially distortion-free) digitized output (y).

More specifically with reference to FIG. 1, ADC 100 is a VCO-based ADC that includes a differential signal path to receive an incoming differential input analog signal (ADCin_p and ADCin_n). This incoming analog signal may be received from a variety of different sources in different architectures. In an example implementation herein, this VCO-based ADC may be present in a digital TV demodulator configured to receive incoming analog signals after receipt from a given source (e.g., cable, satellite or so forth) and front end processing, which may be performed in a separate tuner, in some cases.

As seen, primary circuit 110 includes differential VCO ADC core units 115$p$ and 115$n$ in order to suppress even-order distortion terms. Details of an example core 115 will be described below. Suffice to say, in an embodiment cores 115 may be implemented as ring oscillator-based ADC core units. As seen, the resulting digitized outputs from core units 115 may be provided to a combiner circuit 120, which combines the digitized outputs and provides them to a decimation filter 130 to reduce a sampling rate of the digitized signals. In an embodiment, decimation filter 130 may be configured for a decimate-by-4 operation to provide a digitized output stream at a sample rate of approximately 200 Megasamples per second (MS/s). Note that in different embodiments, depending on a required dynamic range, a wide variety of bit width outputs can be realized by a given ADC design. In an example, ADC 100 may be configured to generate an 11-bit output, although embodiments are not limited in this regard.

As discussed, there may be some amount of third-order distortion present in the output of primary circuit 110. Note that the distortion mainly arises from the non-linearity of the tuning curve of the oscillator. This distortion may vary based on particular device characteristics, and can also vary based on one or more of process, voltage, and/or temperature at which an ADC operates. In some cases, a relatively small number of stored coefficient values can be used to provide for distortion cancellation since the distortion is mainly frequency independent. In other cases, a dynamically determined coefficient value may be used.

As illustrated, cancellation circuit 150 is configured in a feed forward arrangement in which the output (x) of primary circuit 110 is provided as an input to cancellation circuit 150 and further to a combiner 180 coupled to an output of cancellation circuit 150 (note in some cases, combiner 180 may be part of the cancellation circuit itself). In the embodiment shown, a static cancellation circuit is provided to receive the distortion-included digitized signal x, which is provided to a function generator 160. In an embodiment, function generator 160 may be configured as a cube operator to generate a cubed value of the digitized output x and provide it to a gain circuit 170. In various embodiments, gain circuit 170 may be configured as a fixed and/or controllable amplifier (and/or multiplier) to receive the cubed value output by function generator 160 and apply a coefficient value $\alpha$ to this value to generate a cancellation signal $\alpha x^3$.

When provided to combiner 180, a distortion-cancelled output y is realized. Understand while shown at this high level in the embodiment of FIG. 1, many variations and alternatives are possible.

Figure 2:
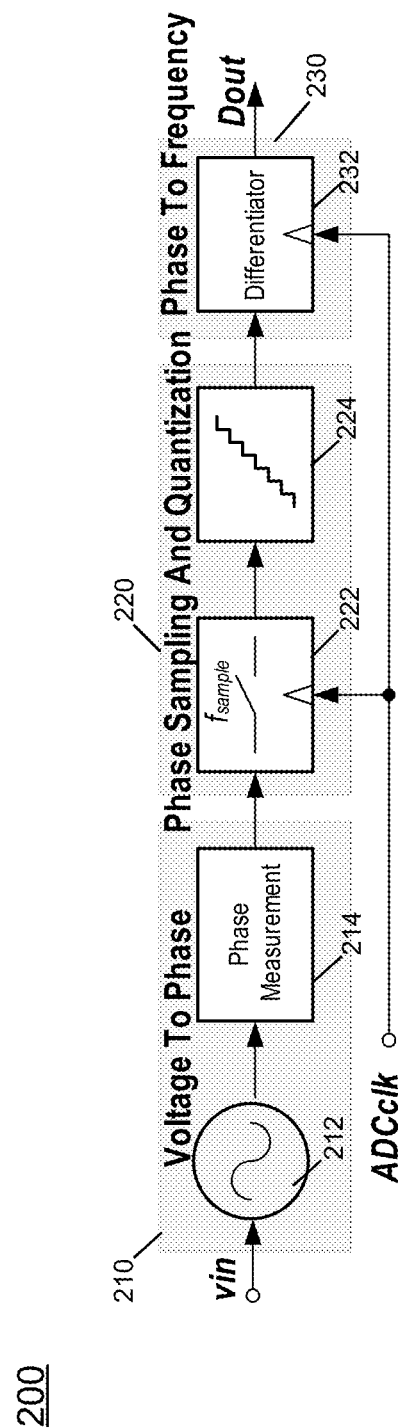
FIG. 2 is a block diagram of an example ring oscillator-based ADC in accordance with an embodiment.

Referring now to FIG. 2, shown is a block diagram of an example ring oscillator-based ADC in accordance with an embodiment. As shown in FIG. 2, ADC 200 is configured to receive an incoming voltage signal Vin and generate a digitized output Dout therefrom. As further seen, ADC 200 also is configured to receive a clock signal (ADCclk) used to control timing within the ADC. In the embodiment shown, ADC 200 includes a voltage-to-phase circuit 210, a phase-to-quantized phase circuit 220, and a phase-to-frequency circuit 230.

More specifically, circuit 210 receives an incoming voltage Vin, provided to a VCO 212, which in this embodiment may be a ring oscillator, such as a 32-stage ring oscillator. In turn, the resulting output of VCO 212 is provided to a phase measurement circuit 214 that in turn provides a phase signal to a sampler circuit 222 of circuit 220, which is controlled by the received clock signal (ADCclk). In turn, the resulting sampled output is provided to a phase quantization circuit 224, and in turn is provided to a differentiator circuit 232 of circuit 230 to thus generate the digitized output (Dout) which may be a multi-bit signal, e.g., a 6-bit signal in an embodiment. For a 32-stage oscillator, the VCO ADC output can be 6-bits. When combined with the complementary path it becomes 7-bits. After decimation, depending on the decimation factor, the output can be 11-bits (e.g., 11-bits for D=4).

While this ring oscillator-based ADC may be suitable in many cases, there can be non-linearity issues that could limit resolution. As such, embodiments provide the compensation or cancellation circuit, as discussed above with regard to FIG. 1 to provide for cancellation of such non-linearities.

Figure 3:
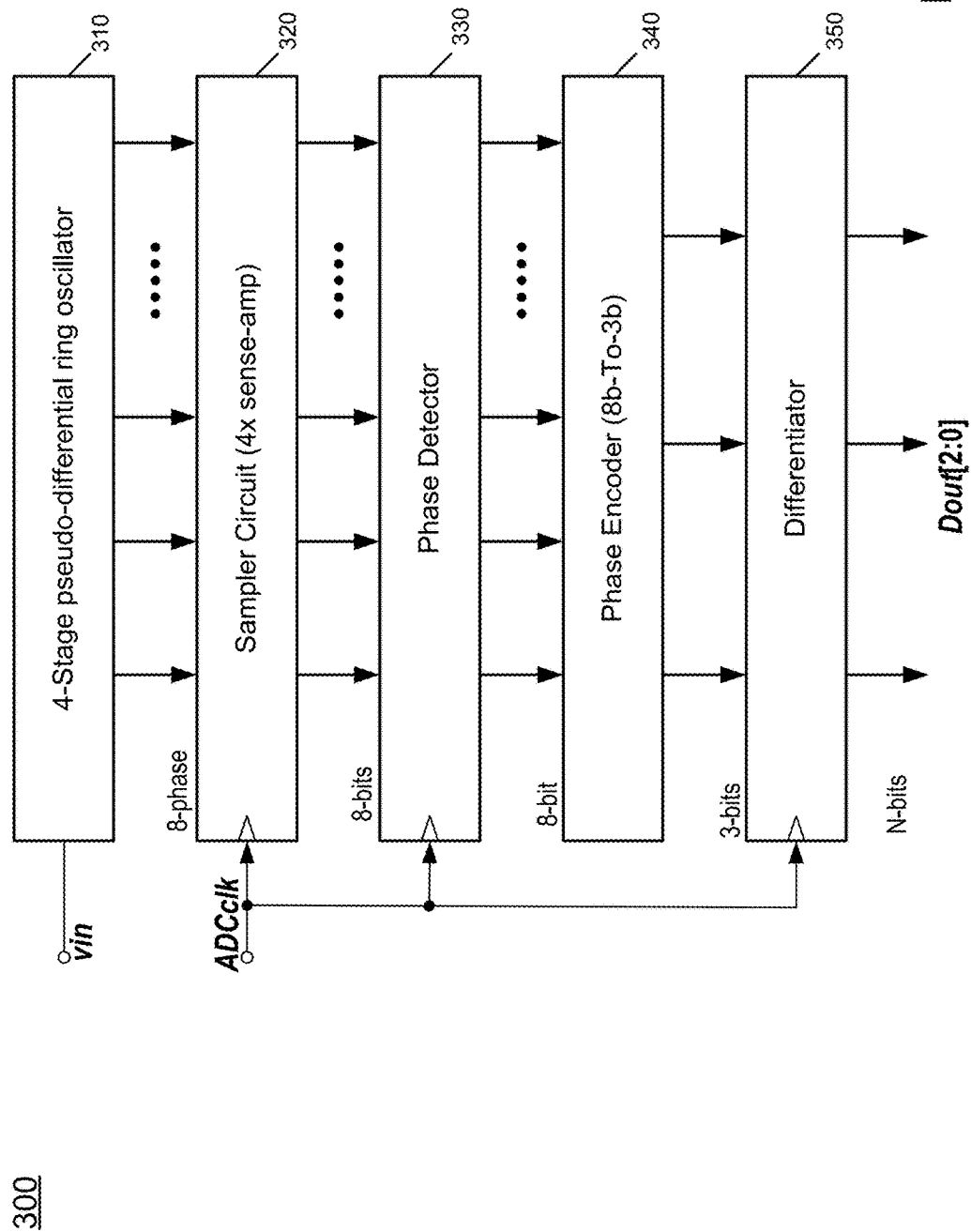
FIG. 3 is a block diagram of further details of an ADC in accordance with an embodiment.

Referring now to FIG. 3, shown is a block diagram of further details of an ADC in accordance with an embodiment. As shown in FIG. 3, ADC 300 is configured as a ring oscillator-based ADC having a N-stage pseudo differential ring oscillator 310 (e.g., a 4-stage ring oscillator) that is coupled to a sampler circuit 320. In turn, sampler circuit 320, which may be implemented with a set of sense amplifiers, provides sampled phase outputs to a phase detector 330. In turn, the phase detected outputs may be provided to a phase encoder 340, which in an embodiment may be similar to a thermometer-to-binary converter, that in turn provides an output to a differentiator 350 to generate the digitized output Dout.

Figure 4:
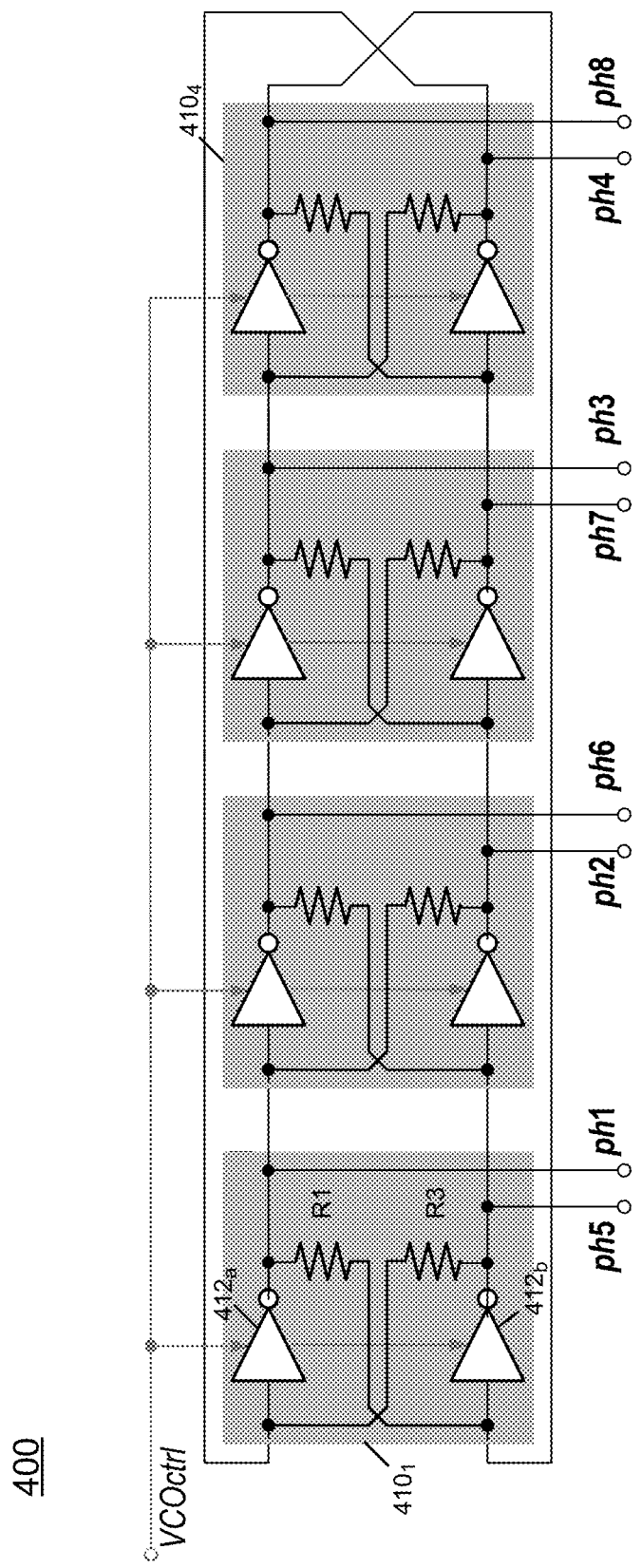
FIG. 4 is a schematic diagram of a representative four-stage ring oscillator in accordance with an embodiment.

Referring now to FIG. 4, shown is a schematic diagram of a representative four-stage ring oscillator in accordance with an embodiment. As shown in FIG. 4, ring oscillator 400 includes a plurality of stages $410_1$-$410_4$. As seen, each stage includes parallel coupled inverters 412a and 412b, in which outputs are fed back via oppositely coupled resistors R1 and R3. Note that inverters 412 are driven by a voltage signal, namely $VCO_{CTRL}$. As such, in embodiments ring oscillator 400 may be controlled in a voltage-controlled mode, which may provide for lower second-order distortion, as compared to an arrangement in which the inverters are driven in a current-starved mode. The outputs of each inverter stage 410 are provided as phase signals to a sampler circuit (such as sampler circuit 320).

Figure 5:
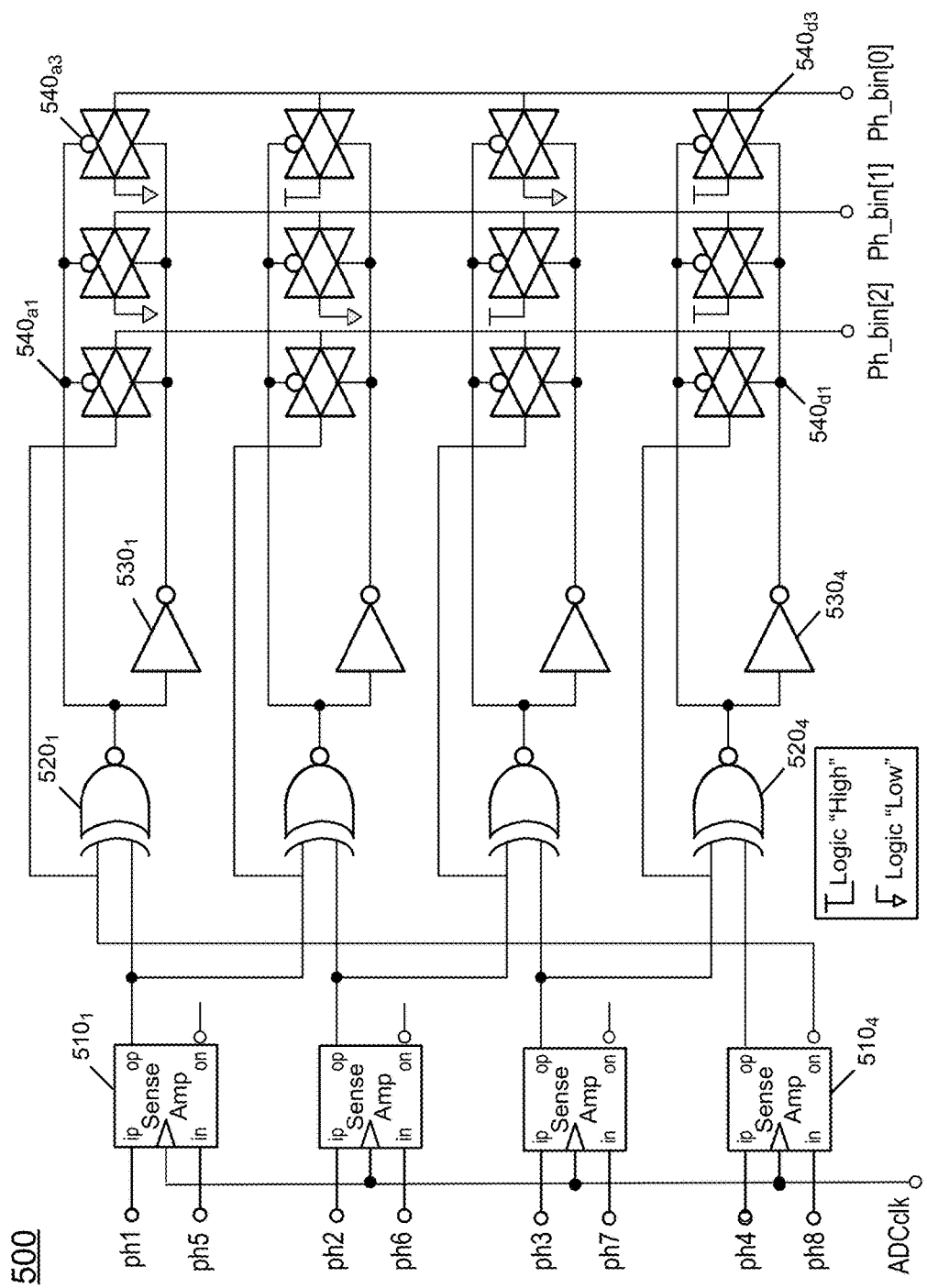
FIG. 5 is a block diagram of further details of a sampler and conversion circuit of an ADC in accordance with an embodiment.

Referring now to FIG. 5, shown is a block diagram of further details of a sampler and conversion circuit of an ADC in accordance with an embodiment. As shown in FIG. 5, circuit 500 includes a plurality of sense amplifiers $510_1$-$510_4$. As seen, each sense amplifier is configured to receive two phase input signals and generate an output value. In an embodiment, sense amplifier 510 may be configured as a combination of MOSFET-based differential amplifiers, a resettable latch stage, and a logic stage (one or more NAND gates (to form a SR-latch and buffers)) to generate one or more outputs ($o_p$ and possibly $o_n$). As seen, the outputs of sense amplifiers 510 are coupled to corresponding exclusive-OR (XOR) circuits $520_1$-$520_4$ that in turn are coupled to inverters $530_1$-$530_4$. As further illustrated, the outputs of XORs 520 are coupled to a plurality of transmission gates $540_{a1}$-$540_{a3}$-$540_{d1}$-$540_{d3}$ to thus generate a three-bit binary phase value (Ph_bin[2:0]). These incoming binary phase values may then be converted to a given digital value in a differentiator circuit.

Figure 6:
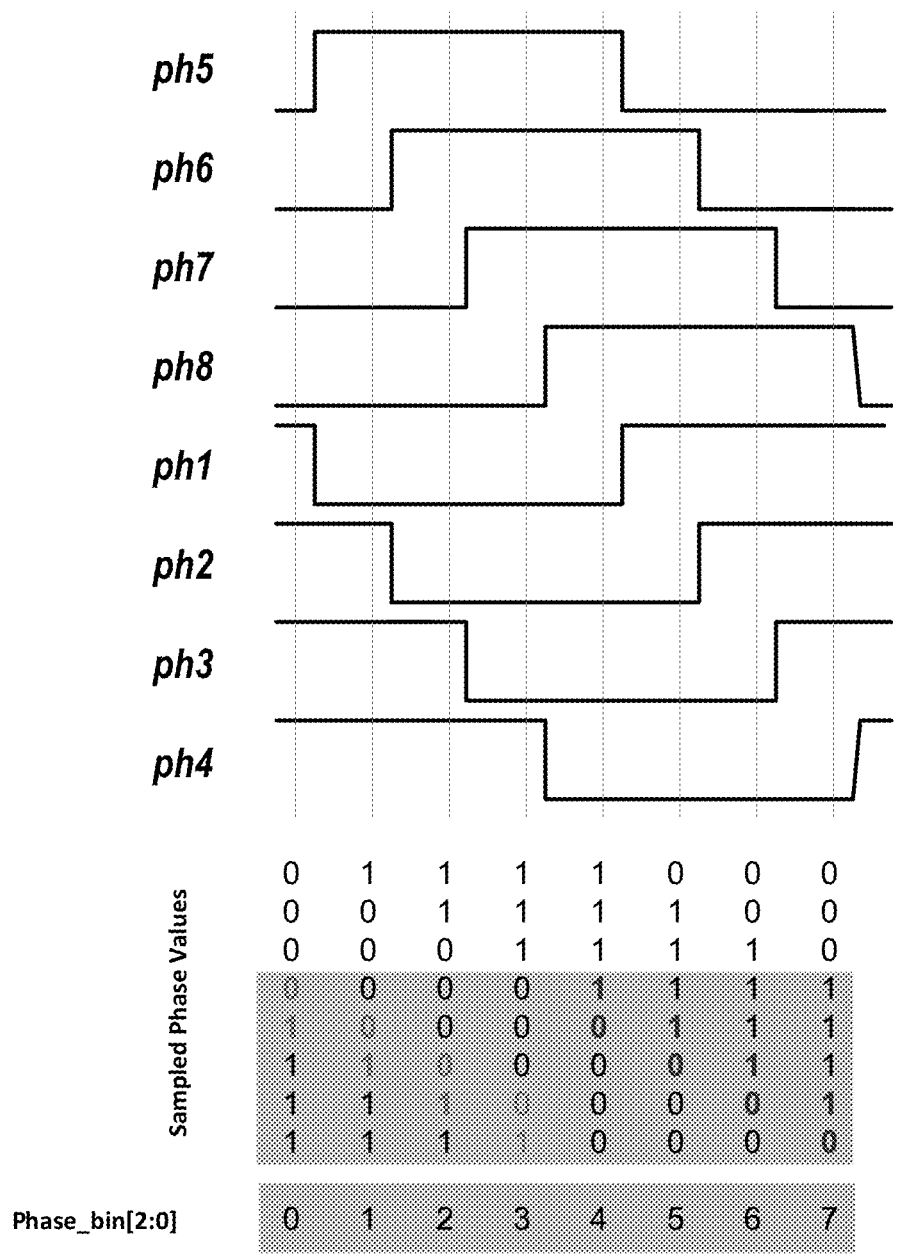
FIG. 6 is a graphical illustration of a set of sampled phase values obtained from sampled phase information of an ADC in accordance with an embodiment.

Referring now to FIG. 6, shown is a graphical illustration of a set of sampled phase values obtained from sampled phase information of an ADC in accordance with an embodiment. As seen, the resulting binary phase values, which may be encoded in a three-bit format, can in turn be digitized to generate a 3-bit digital output.

Figure 7:
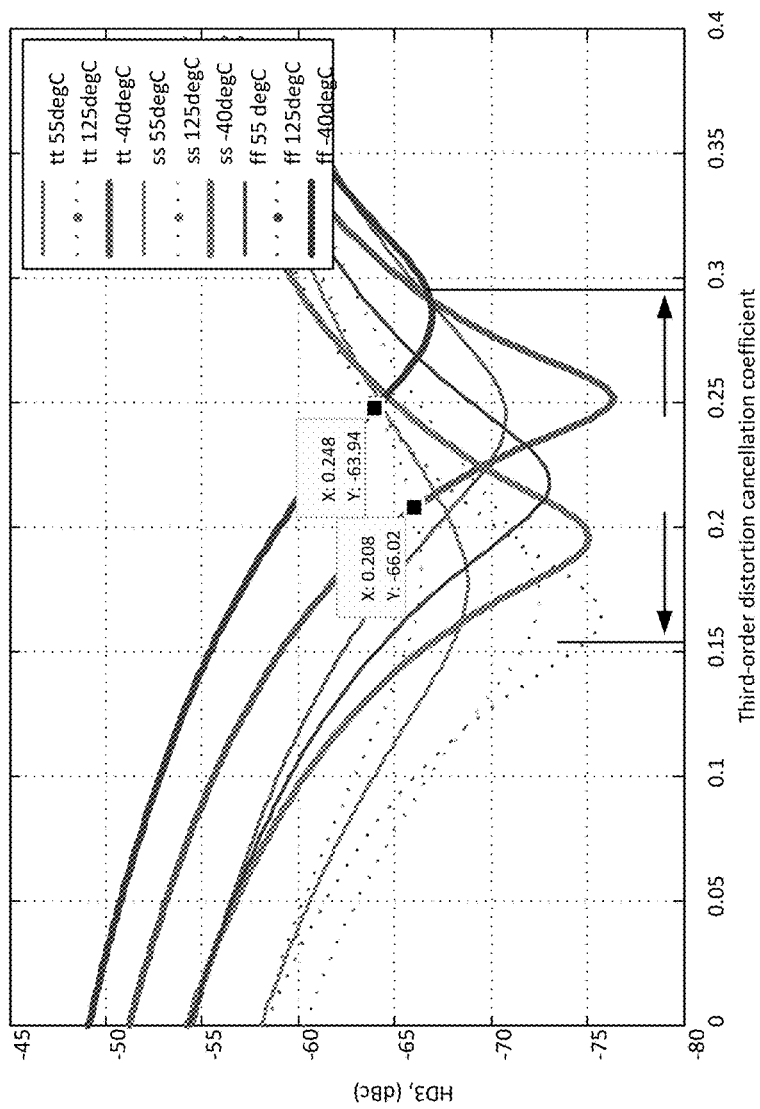
FIG. 7 is a graphical illustration of a third-order distortion cancellation function in accordance with an embodiment.

As discussed above, in particular circuit implementations, non-linearities may exist that can be corrected in accordance with different embodiments herein. Referring now to FIG. 7, shown is a graphical illustration of a third-order distortion cancellation function in accordance with an embodiment. As illustrated in FIG. 7, the Y-axis represents a measure of third-order harmonic distortion (as measured in dBc), while the X-axis represents a third-order cancellation coefficient value. Understand while shown with a representative range of distortions and coefficient values in FIG. 7 for purposes of illustration, such values can vary widely depending on different conditions and/or parameters. As such, the actual values shown in FIG. 7 are for example only and in many actual circuits, these values can differ widely.

As shown in FIG. 7, a cancellation coefficient value can be determined within a range based on analysis of representative circuits, which may be considered at a variety of different performance characteristics, including process, voltage and temperature, in some cases.

As illustrated, for three representative circuit corners (e.g., typical, slow and fast process corner circuits), and further considered at multiple temperatures (e.g., nominal, low and high), a suitable level of third-order distortion cancellation can be realized with coefficient values in a range of between approximately 0.15 and 0.3.

Based on the example coefficients shown in FIG. 7, a set of fixed coefficient values can be determined for a particular chip and then fused into manufactured products. For example, such values can be stored in a non-volatile storage of the part, and/or may be written into a part as firmware-coded values. Understand that multiple coefficient values may be provided in a particular part to enable usage of different coefficient values based on operating conditions. For example, based on thermal information received from one or more thermal sensors within a part, a microcontroller may select an appropriate coefficient value associated with a temperature range at which the product is operating to provide a most appropriate coefficient value. To this end, a controller such as a microcontroller may be configured to execute instructions stored in one or more non-transitory storage media, such as one or more flash memories, read only memory, or other non-volatile storage to perform control operations as described herein.

Figure 8:
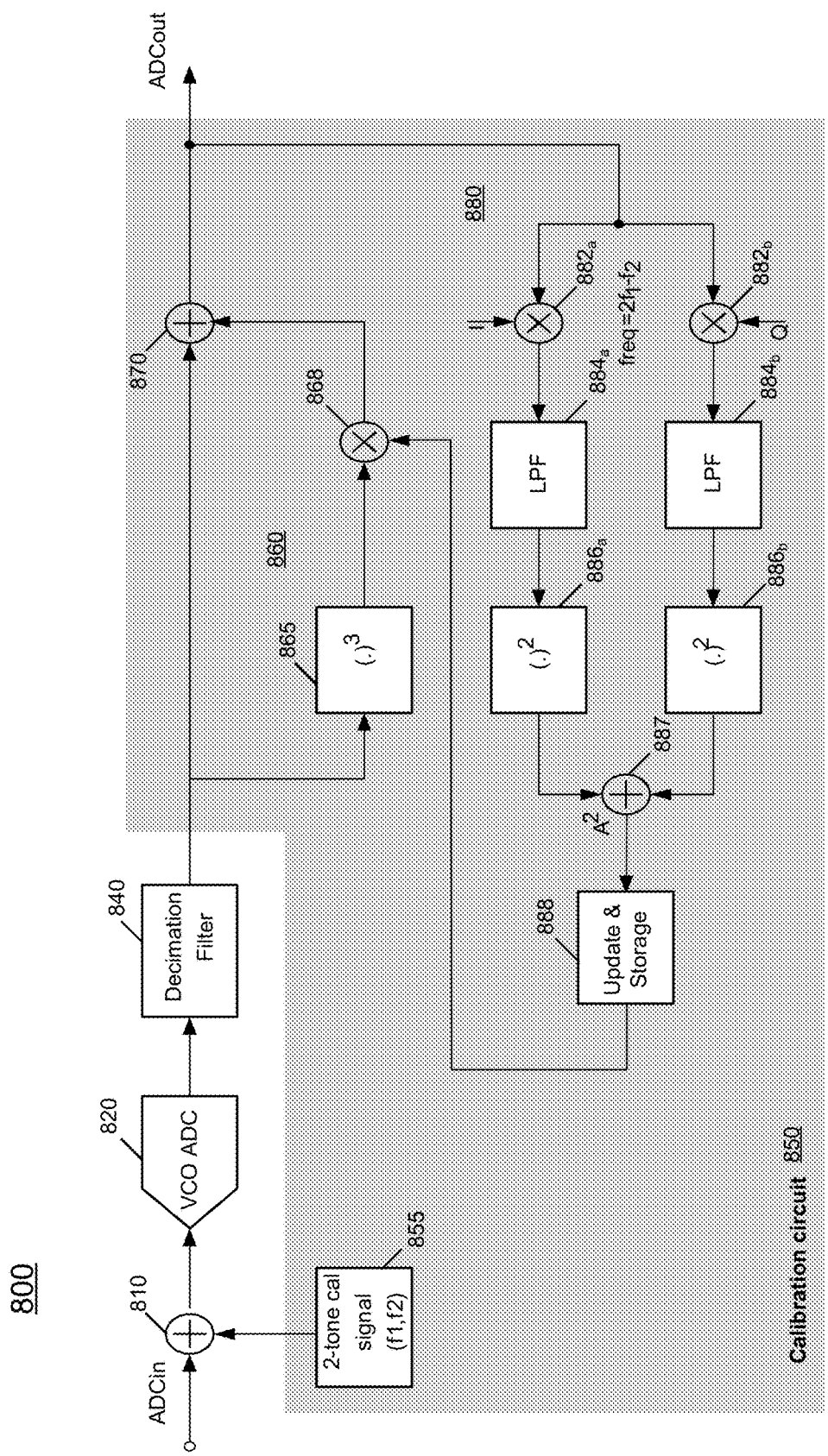
FIG. 8 is a block diagram of a portion of a receiver in accordance with another embodiment.

In other cases, instead of static coefficient values, an ADC may be configured to provide a dynamic coefficient value to be used for non-linearity cancellation. Referring now to FIG. 8, shown is a block diagram of a portion of a receiver in accordance with another embodiment. As shown in FIG. 8, receiver 800 is coupled to receive an incoming analog signal, provided through a summer 810 to a VCO-based ADC 820, which may be configured as a ring oscillator, as described above. The resulting digitized output, which may have non-linearities and/or other distortion, is provided to a decimation filter 840. In turn, the resulting decimated digitized signal is provided to a calibration circuit 850 (which performs both a calibration of the coefficient value and the distortion cancellation described herein (and is thus equally referred to as cancellation circuit 850)).

Note that in various embodiments, summer 810 may more specifically be controlled as a switch to provide the incoming analog signal to the processing path during normal operation. Instead, during a calibration mode when a coefficient value is to be dynamically determined for use in cancellation circuit 850, this incoming analog signal can be bypassed, and an incoming calibration signal, which may be a (single or) two-tone calibration signal having frequencies F1 and F2, can be provided from a calibration signal source 855 of cancellation circuit 850.

Cancellation circuit 850 includes a feed forward path 860 (which may be a correction circuit) and a feedback path 880 (which may be a calibration loop circuit). More specifically, feed forward path 860 may include a function generator 865, which in an embodiment can be configured as a cube function generator to provide a cubed value of the output of decimation filter 840. In turn, this cubed value is provided to a multiplier 868, where a product is generated based on this cubed value and an output of feedback loop 880. In general, feedback loop 880 is configured to generate a dynamic coefficient value based on processing of a calibration signal during a calibration mode. In an embodiment, the calibration can be performed at start-up. Or if the two-tone frequencies f1 and f2 are chosen appropriately outside the desired signal band (i.e., their third order intermodulation terms, 2f1-f2 and 2f2-f1 are also outside the desired bandwidth and do not interfere with the desired signal's distortion terms), the calibration can be run continuously in the background during normal operation.

As illustrated, feedback loop 880 is configured to receive the distortion cancelled digitized output and, in a calibration mode receive incoming I and Q calibration signals at mixers 882a and 882b at a given calibration frequency. Note that the mixing signals are generated from the same source that generate f1 and f2, which are normally an integer divided value of the ADC clock signal, ADCclk. In case there is only one calibration tone with frequency f1, mixer signals have frequencies 3f1 (i.e., third harmonic of f1). In case there are two-tones f1, and f2, then I and Q have a frequency of 2f1-f2 or 2f2-f1 (i.e., the third-order intermodulation term frequency). The downmixed signals are provided to filters 884a, 884b, which in an embodiment may be low pass filters. In turn, the filtered signals are provided to function generators 886a, 886b, which may generate squared values, in turn provided to a combiner 887. Combiner 887 may be configured to generate an error signal value proportional to the power of a lower intermodulation tone, $A^2$. In turn, this power value $A^2$ may correspond to the dynamic coefficient value, which may provide for third-order distortion adjustment based on current operating parameters of the device. This dynamically determined coefficient value can be updated until the value of $A^2$ is minimized, then the result is frozen and stored in a storage 888.

Then during normal operation (at least until a next calibration is run), this coefficient value can be provided to multiplier 868. Note that in some cases, some of the circuitry present in calibration circuit 850 may be implemented using already-existing circuitry within a digital portion of a receiver signal path, such that the need for additional hardware to provide for this calibration loop can be avoided.

Using an embodiment as described herein, linearity of an ADC can be improved. As one example, assume an ADC design without an embodiment has a SNR of 76 dB and 40 dB of spurious free dynamic range (SFDR) for a full scale input. By using complementary paths as described herein, even-order distortion terms may be suppressed, leaving any remaining residue due to mismatches only. Still further, by using a voltage controlled oscillator instead of a current-starved oscillator, second-order distortion terms may further be reduced, avoiding the need for any further second-order cancellation. Finally, a cancellation circuit as described herein may further suppress third-order distortion. In this way, lower HD2 and HD3 may be realized with sufficient SNR (e.g., 70 dB SNR) (by reducing amplitude by 6 dB) and high SFDR (e.g., 67 dB SFDR). As one example, HD2 may be reduced to approximately −84 dB and HD3 may be reduced to approximately −73 dB, although other examples are possible.

Figure 9:
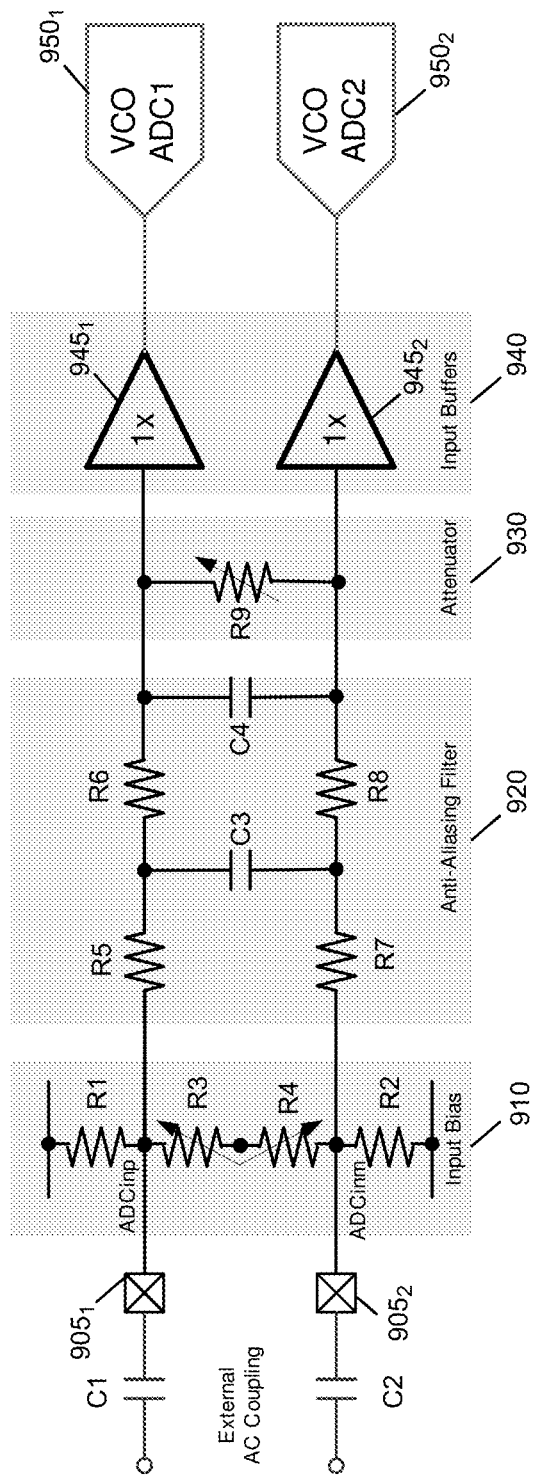
FIG. 9 is a schematic diagram illustrating an input circuit in accordance with an embodiment.

Referring now to FIG. 9, shown is a schematic diagram illustrating an input circuit of a receiver, tuner, demodulator or other device that includes an ADC in accordance with an embodiment. Using embodiments described herein, a complexity of a front end to the ADC may be simplified, as the high clock rate of the ADC and its inherent anti-aliasing characteristics can lower front end complexity. As shown in FIG. 9, device 900 may be a demodulator implemented on a single semiconductor die, such as a CMOS-based demodulator. Incoming signals received, e.g., from an external tuner, may be provided through AC coupling capacitors C1 and C2 and via input signal pins $905_1$ and $905_2$ to an input bias circuit 910. In the embodiment shown, input bias circuit 910 may be implemented as a series stack of resistors R1-R4 coupled between a supply voltage node and a reference voltage node.

Next, the incoming analog signals may be provided through an anti-aliasing filter 920. In an embodiment, anti-aliasing filter 920 may provide an appropriate amount of anti-aliasing suppression, e.g., approximately 20 dB. In the embodiment shown, filter 920 may be configured using series-coupled resistors R5, R6-R7, R8 and parallel capacitors C3 and C4. In turn, the filtered output of anti-aliasing filter 920 is coupled to an attenuator 930, which in an embodiment may be implemented as a parallel-coupled variable resistance R9. Note that attenuator 930 may provide an appropriate amount of attenuation, as incoming signals may be at a higher voltage level than suitable for handling in corresponding ADCs. In an embodiment, attenuator 930 may be programmably controlled, e.g., by an on-chip microcontroller (not shown for ease of illustration in FIG. 9). In turn, the attenuated analog signals may be provided through an input buffer circuit 940, which in the embodiment shown may be implemented as unity-gain input buffers $945_1$, $945_2$, to provide appropriately buffered signals to differential ADCs $950_1$, $950_2$, which may be implemented as VCO-based ADCs, as described herein.

As such, distortion reduced/cancelled digitized signals may be provided for further operations within the demodulator. For example, these digitized signals can be provided to a digital signal processor to perform appropriate digital processing to output demodulated signals. In turn, the demodulated signals may be provided to a given signal processor, such as an audio and/or video processor to perform decoding and output of analog/video signals. Understand while shown at this high level in the embodiment of FIG. 9, many variations and alternatives are possible.

While examples described herein are with reference to ADCs for use in a digital demodulator circuit, understand that embodiments are not so limited and VCO-based ADCs having correction circuitry as described herein may be implemented in other receiver signal paths having high signal bandwidths and low power consumption and size. As an example, embodiments may apply equally to other receivers such as wireless receivers (such as a short-range wireless communication systems, e.g., a so-called Wi-Fi receiver).

Figure 10:
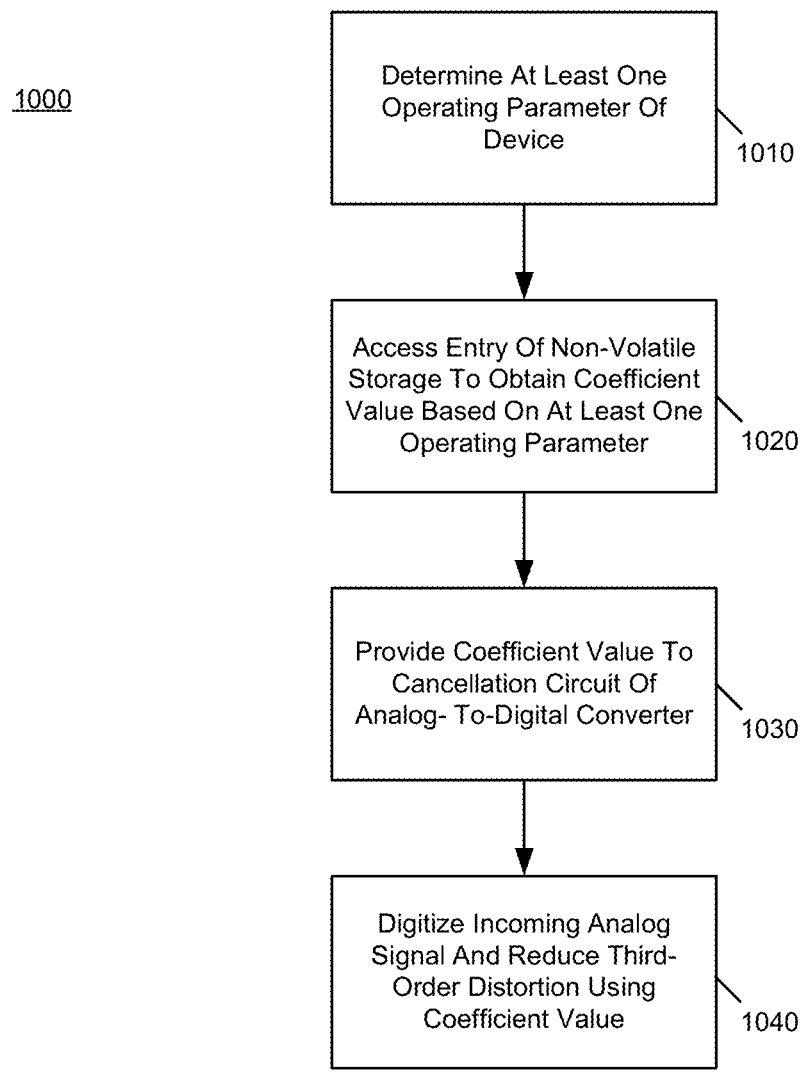
FIG. 10 is a flow diagram of a method in accordance with an embodiment.

Referring now to FIG. 10, shown is a flow diagram of a method in accordance with an embodiment. As an example, method 1000 may be performed by a controller, such as a microcontroller unit present in a demodulator or other circuit including an ADC as described herein. In general, method 1000 may be used to determine an appropriate coefficient value to apply to a cancellation circuit as described herein.

As seen, method 1000 begins by determining at least one operating parameter of a device, such as a single-chip CMOS-based demodulator (block 1010). As an example, this operating parameter may be temperature, as the microcontroller may be configured to receive thermal information from one or more thermal sensors present within the demodulator. As another example, the at least one operating parameter may also include process, as different coefficient values may be provided for different process corners (e.g., typical, slow and fast). In some cases, such process information may be determined based on a frequency at which a ring oscillator or other VCO of the device is operating.

Next at block 1020, an entry of a non-volatile storage may be accessed based at least in part on the one or more operating parameters. Note that this entry may be accessed, e.g., using a range in which the thermal information is included. As such, an appropriate entry may be accessed that stores a given coefficient value.

Next, at block 1030 this coefficient value may be provided to a cancellation circuit of an ADC for use as described herein. Finally, at block 1040 incoming analog signals may be digitized. Still further, in this cancellation circuit using the coefficient value, third-order distortion present in an intermediate digital output of the ADC may be reduced and/or cancelled. Understand that other means of determining a coefficient value, including a dynamic determination of a coefficient value based on operation of a cancellation circuit may occur in other embodiments such as described above with reference to FIG. 8.

Figure 11:
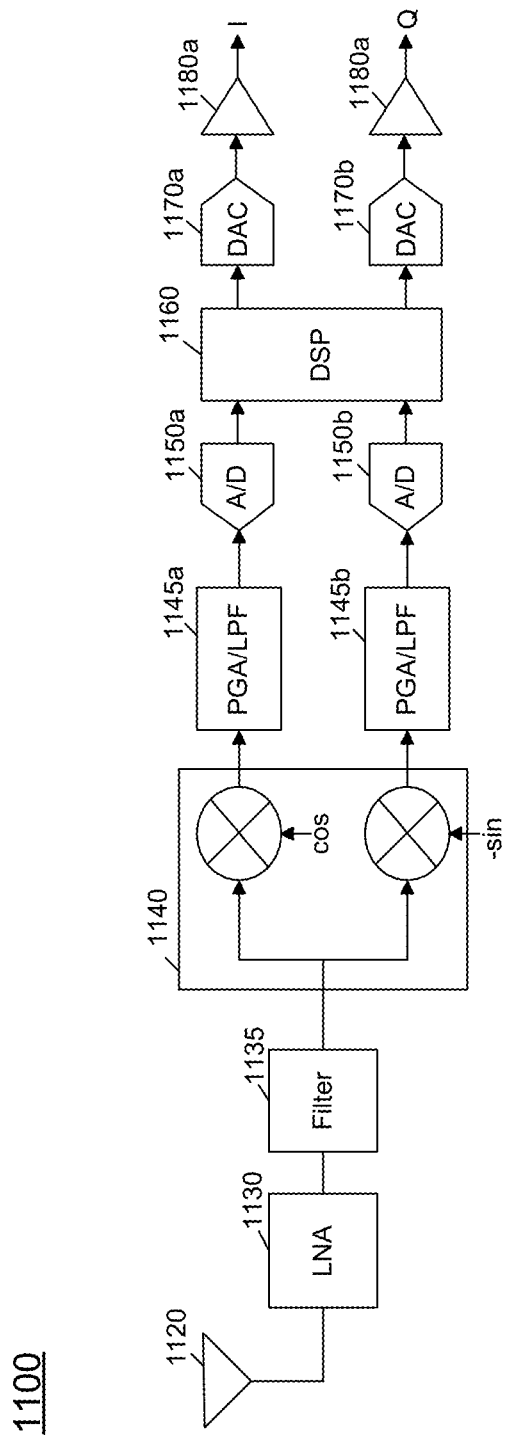
FIG. 11 is a block diagram of a tuner in accordance with one embodiment.

Referring now to FIG. 11, shown is a block diagram of a tuner in accordance with one embodiment. In various implementations, tuner 1100 may be a single chip integrated circuit such as a single die CMOS circuit that acts as a tuner for receiving signals of a given radio frequency (RF). In various embodiments, tuner 1100 may be a television tuner that can be used to receive incoming RF signals, e.g., for a satellite, cable or terrestrial system. However, in other embodiments a receiver can be used in connection with other wireless receivers such as for wireless communication within short range or long range wireless systems, such as a local area network or wide area network. In general, tuner 1100 includes both analog and digital circuitry.

As seen, incoming signals, which may be RF signals received over the air or in another manner, may be received by an antenna 1120 that in turn is coupled to a low noise amplifier (LNA) 1130. LNA 1130 is in turn coupled to a filter 1135. In various embodiments, filter 1135 may be a tracking filter, bandpass filter or other such filter, depending on a given implementation.

The filtered and amplified RF signals are then provided to a mixer 1140, which may be a complex mixer to downconvert the signals to a lower frequency. Mixer 1140 may downconvert the signals to an intermediate frequency (IF), a zero IF (ZIF), or baseband, depending on a desired implementation. To effect frequency conversion to these different frequency ranges, a selected one of multiple local oscillator signals may be provided to the complex mixer.

Given the complex mixer, the output of the mixer may be complex signals, namely I and Q signals provided on I and Q signal paths. As seen, the baseband complex signals are provided to corresponding programmable gain amplifiers/low pass filters $1145_a$-$1145_b$. As further seen in FIG. 11, the outputs of blocks 1145 may be provided to corresponding digitizers, namely analog-to-digital converters (ADCs) $1150_a$ and $1150_b$, which may be implemented as VCO-based ADCs as described herein, that provide digital samples to a digital signal processor (DSP) 1160. In DSP 1160, various filtering including channel filtering and other processing can be performed on the incoming digital signals. By performing such processing digitally, improvements in area and power consumption can be realized. After the digital processing occurs, the processed digital signals are provided to corresponding digital-to-analog converters (DACs) $1170_a$ and $1170_b$. There, the signals are converted back to analog signals that are provided to corresponding output buffers $1180_a$ and $1180_b$, which may drive the signals off-chip to downstream circuitry such as a demodulator implemented in a separate integrated circuit (and which also may include VCO-based ADCs as described herein).

Figure 12:
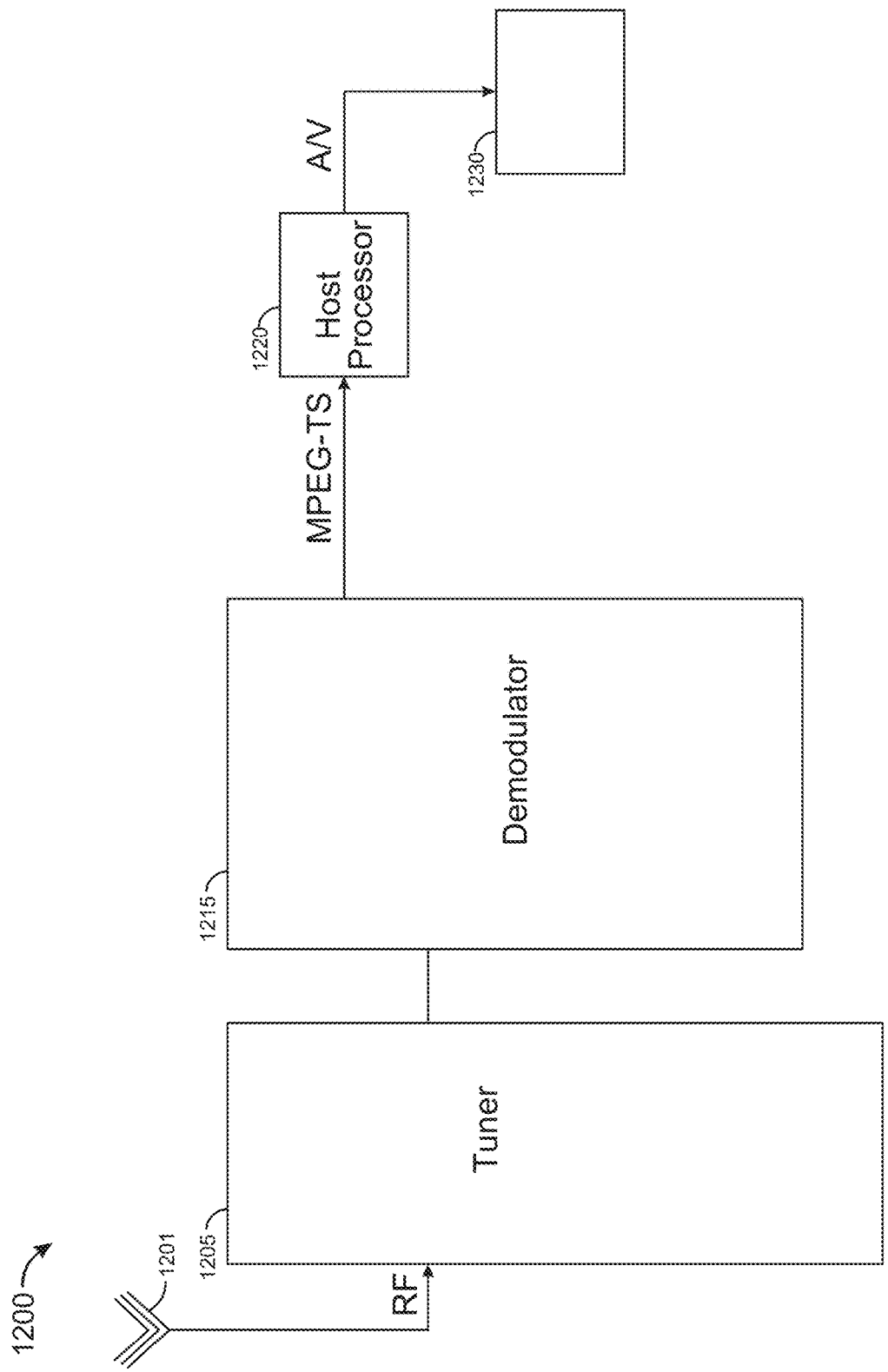
FIG. 12 is a block diagram of a system in accordance with one embodiment.

Embodiments may be implemented in many different system types, such as set-top boxes, high definition or standard digital televisions, and so forth. Some applications may be implemented in a mixed signal circuit that includes both analog and digital circuitry. Referring now to FIG. 12, shown is a block diagram of a system in accordance with one embodiment. As shown in FIG. 12, system 1200 may include a television that is coupled to receive an RF signal from an antenna source 1201 such as an over-the-air antenna. However, in other embodiments, the original source may be cable distribution, satellite, or other source that is then redistributed through a digital terrestrial network. The incoming RF signal may be provided to a tuner 1205 which may be, in one embodiment a single-chip tuner including one or more tuners.

The incoming RF signal is thus provided to tuner 1205 for tuning to one or more desired signal channels. Tuner channels may include various circuitry. For example, in one embodiment each channel may include an amplifier having an output coupled to a bandpass filter. In turn the filtered output of this bandpass filter is coupled to a mixer. In turn, the mixer downconverts the incoming RF signal to an IF output, which may be further processed (e.g., amplified and filtered) via a signal processing path.

Referring still to FIG. 12, the output of tuner 1205 may be provided to additional processing circuitry including a demodulator circuit 1215, which may include VCO-based ADCs (as described herein). Demodulator circuit 1215 may demodulate the digitized signals. The output of demodulator 1215 may correspond to a transport stream such as an MPEG-TS that is provided to a host processor 1220 for further processing into an audio visual signal that may be provided to a display 1230, such as a computer monitor, flat panel television or other such display.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first voltage controlled oscillator (VCO) analog-to-digital converter (ADC) unit to receive a first analog signal and convert the first analog signal into a first digital signal;
a decimation filter circuit to receive the first digital signal and filter the first digital signal into a filtered first digital signal; and
a cancellation circuit feed forward coupled to receive the filtered first digital signal and generate an output first digital signal based at least in part on a coefficient value, to reduce third-order distortion.

2. The apparatus of claim 1, wherein the cancellation circuit is to obtain the coefficient value from a non-volatile storage.

3. The apparatus of claim 2, wherein the non-volatile storage is to store a plurality of coefficient values, each associated with at least one of a temperature range and a process type.

4. The apparatus of claim 3, further comprising a controller to select the coefficient value from the plurality of coefficient values based on temperature information of the apparatus received from at least one thermal sensor.

5. The apparatus of claim 1, wherein the cancellation circuit includes:
a first function generator to generate a cubed value of the filtered first digital signal;
a gain circuit to apply the coefficient value to the cubed value to generate a cancellation signal; and
a combiner to combine the filtered first digital signal and the cancellation signal to obtain the output first digital signal.

6. The apparatus of claim 1, wherein the cancellation circuit is further to reduce second-order distortion.

7. The apparatus of claim 1, wherein the first VCO ADC unit comprises a first voltage-controlled ring oscillator and further comprising a second VCO ADC unit comprising a second voltage-controlled ring oscillator, to reduce second-order distortion.

8. The apparatus of claim 7, wherein the second VCO ADC unit is to receive a second analog signal and convert the second analog signal into a second digital signal, and a second combiner to form a combined digital signal from the first digital signal and the second digital signal.

9. The apparatus of claim 1, wherein the cancellation circuit comprises:
a first function generator to generate a cubed value of the filtered first digital signal;
a calibration circuit to receive a digitized calibration signal, calculate a power value therefrom, and generate the coefficient value based on the power value;
a multiplier to generate a product of the cubed value and the coefficient value; and
a second combiner to combine the product and the filtered first digital signal.

10. The apparatus of claim 9, wherein the first function generator is coupled in feed forward between the decimation filter circuit and the second combiner.

11. The apparatus of claim 9, further comprising a tone generation circuit to provide a calibration signal corresponding to the digitized calibration signal to the first VCO ADC unit in a calibration mode to enable the calibration circuit to generate the coefficient value.

12. The apparatus of claim 1, wherein the first VCO ADC unit comprises:
a ring oscillator to receive the first analog signal and output a plurality of phase signals;
a plurality of sampler circuits to receive the plurality of phase signals and output a plurality of sampled signals;
a plurality of phase detectors to detect a phase between a pair of the plurality of sampled signals;
a plurality of encoders to receive the detected phase and generate binary outputs; and
a differentiator to receive the binary outputs and generate the first digital signal.

13. A system comprising:
a tuner to receive a radio frequency (RF) signal, the tuner comprising:
a first filter to filter the RF signal; and
a mixer to downconvert the filtered RF signal to a second frequency signal comprising a differential analog signal; and
a demodulator coupled to the tuner to receive the second frequency signal, the demodulator comprising:
a differential analog-to-digital converter (ADC) coupled to the mixer, the differential ADC comprising:
a first voltage controlled oscillator (VCO) analog-to-digital converter (ADC) unit to receive and convert a first portion of the differential analog signal to a first digital value;
a second VCO ADC unit to receive and convert a second portion of the differential analog signal to a second digital value;
a first combiner to form a combined digital signal from the first and second digital values;
a correction circuit to receive the combined digital signal and generate a third-order distortion cancelled digital signal therefrom, using a coefficient value; and
demodulator circuitry to demodulate the third-order distortion cancelled digital signal and output a transport stream.

14. The system of claim 13, wherein the first VCO ADC unit comprises a first voltage-controlled ring oscillator and the second VCO ADC unit comprises a second voltage-controlled ring oscillator, to remove second-order distortion from the combined digital signal.

15. The system of claim 13, wherein the first VCO ADC unit comprises:
a ring oscillator to receive the first portion of the differential analog signal and output a plurality of phase signals;
a plurality of sampler circuits to receive the plurality of phase signals and output a plurality of sampled signals;
a plurality of phase detectors to detect a phase between a pair of the plurality of sampled signals;
a plurality of encoders to receive the detected phase and generate binary outputs; and
a differentiator to receive the binary outputs and generate the first digital value.

16. The system of claim 13, wherein the correction circuit comprises:
a cancellation loop circuit having:
a first function generator to generate a cubed value of the combined digital signal;
a gain circuit to apply the coefficient value to the cubed value to generate a cancellation signal; and
a second combiner to combine the combined digital signal and the cancellation signal to obtain the third-order distortion cancelled digital signal.

17. The system of claim 16, wherein the first function generator is coupled in feed forward between the first combiner and the second combiner.

18. The system of claim 13, wherein the correction circuit comprises:
a calibration loop circuit having:
a mixer to receive the combined digital signal and mix the combined digital signal with a mixing signal to obtain a mixed signal;
a filter to filter the mixed signal;
a second function generator to generate a squared value of the filtered mixed signal; and
a third combiner to generate the coefficient value from the squared value.

19. A method comprising:
determining at least one operating parameter of a device;
accessing an entry of a non-volatile storage to obtain a coefficient value based on the at least one operating parameter; and
providing the coefficient value to a cancellation circuit of an analog-to-digital converter of the device, to enable the cancellation circuit to reduce third-order distortion in a digital value generated in the analog-to-digital converter from an analog signal.

20. The method of claim 19, further comprising:
in a first mode, determining the at least one operating parameter and accessing the entry;
in a second mode, generating the coefficient value in a calibration circuit; and
disabling the calibration circuit after generating the coefficient value.

\* \* \* \* \*